United States Patent [19]

Bach et al.

[11] Patent Number: 4,733,173
[45] Date of Patent: Mar. 22, 1988

[54] ELECTRONIC COMPONENT MEASUREMENT APPARATUS

[75] Inventors: Heinz-Gunter Bach; Wolfgang Dressler, both of Berlin, Fed. Rep. of Germany

[73] Assignee: Hewlett-Packard Company, Palo Alto, Calif.

[21] Appl. No.: 792,939

[22] Filed: Oct. 30, 1985

[30] Foreign Application Priority Data

Nov. 2, 1984 [JP] Japan .................. 59-232224

[51] Int. Cl.$^4$ ........................... G01R 31/26
[52] U.S. Cl. ................. 324/158 D; 324/158 R
[58] Field of Search ........ 324/158 R, 158 SC, 158 D, 324/158 T, 123 C, 130; 340/645; 328/162, 165; 307/491, 494, 526, 358, 359

[56] References Cited

U.S. PATENT DOCUMENTS 4,438,498  3/1984  Sekel et al. ................ 324/158 R

FOREIGN PATENT DOCUMENTS 0224956  7/1985  Fed. Rep. of Germany ... 324/158 R
0017032  1/1982  Japan ........................ 324/158 R
0119283  7/1984  Japan ........................ 324/158 R
0473131  8/1975  U.S.S.R. ..................... 324/158 D
0970263  11/1982 U.S.S.R. ..................... 324/158 R

OTHER PUBLICATIONS

"Automatic Unity Gain Analyzer", by Crauwels et al., 10/66, IBM Tech. Disc. Bull., vol. 9, #5, pp. 461-462.

Primary Examiner—Reinhard J. Eisenzopf
Assistant Examiner—W. Burns
Attorney, Agent, or Firm—James M. Williams

[57] ABSTRACT

Apparatus for measuring the A.C. characteristics of a circuit element under test maintains a stable D.C. bias voltage across the component under test by sensing the difference between the output voltage of the D.C. bias voltage source and the voltage drop across the circuit element under test, to control the D.C. bias voltage applied and to compensate for variable voltage drops in the measurement circuit. The apparatus compensates both for the fixed resistance in the circuit and for the variable resistance due to changing the range resistor.

2 Claims, 4 Drawing Figures

ELECTRONIC COMPONENT MEASUREMENT APPARATUS

BACKGROUND AND SUMMARY OF THE INVENTION

The invention relates to apparatus for measuring the A.C. characteristics, including, for example, the resistance, conductance, and impedance of a circuit element to which both an A.C. test signal and a D.C. test signal are applied simultaneously.

FIG. 2 depicts an example of the component measurement apparatus known in the prior art for performing automatic measurement of the A.C. characteristics of a component with both A.C. and D.C. signals applied simultaneously. The purpose for providing D.C. signals concurrently with A.C. signals has been to obtain the characteristics of the component under test in a simulated operating environment by measuring its characteristics at several levels of D.C. bias and over a range of A.C. frequencies. To make such a measurement, a D.C. bias voltage with an accurate, adjustable value must be superimposed on the A.C. signal applied to the component under test.

The circuit in FIG. 2 shows an example of measuring the characteristics of diode 3, which can be either a schottky diode or a PN-junction diode. In FIG. 2, A.C. power source 1 is connected through a source resistor 2 to one side of the sample diode 3, at terminal A1. The other side of the sample diode 3 is connected at terminal A2 to measurement terminal A6 and to the inverting input of an operational amplifier 5. Measurement terminals A3 and A4 are respectively connected to terminals A1 and A2 at either side of the component under test, sample diode 3. A variable range resistor 4 is connected between the output of operational amplifier 5 and its noninverting input. Measurement terminal A5 is connected to the output of operational amplifier 5. The noninverting input and ground terminal of operational amplifier 5 are tied together and are connected through a capacitor 8 to A.C. power source 1. Monitoring terminal 10 is connected to the noninverting input of operational amplifier 5 through a capacitor 7 and to terminal A1 through resistor 6.

The D.C. bias voltage is supplied by a variable D.C. voltage source 11 connected through transformer 9 across capacitor 8. The positive side of voltage source 11 is connected through the primary winding T1 of transformer 9 to the side of capacitor 8 connected to A.C. source 1. The negative side of variable voltage source 11 is grounded, and the secondary winding T2 of transformer 9 is grounded and connected to the opposite side of capacitor 8.

To make measurements automatically over a range of A.C. frequencies, the amplitude and frequency of A.C. power source 1 and the resistance of variable resistor 4 are automatically controlled by a control circuit (not shown).

In the circuit of FIG. 2, the A.C. current from A.C. power source 1 flows through source resistor 2, diode 3, variable range resistor 4, operational amplifier 5, capacitor 8 and then back to A.C. power source 1.

The D.C. current from voltage source 11 flows through primary winding T1 of transformer 9, A.C. power source 1, source resistor 2, diode 3, variable range resistor 4, operational amplifier 5 and secondary winding T2 of transformer 9 to ground. The D.C. voltatge of the terminal A1 side of diode 3 is measured by connecting a voltmeter to monitoring terminal 10. Resistor 6 and capacitor 7 shunt any A.C. signal and enable terminal 10 to measure only the D.C. voltage.

The frequency-conductance characteristics of sample diode 3 at the selected D.C. bias voltage are measured as follows. First, the output voltage of D.C. power source 11 is allowed to stabilize at the selected value to provide a constant D.C. voltage to diode 3, measured at terminal 10. Then an A.C. signal at the desired frequency is provided from A.C. power source 1. During such initialization, the appropriate value of variable range resistor 4 is automatically selected. The conductance of diode 3 at the applied frequency can be obtained by measuring the A.C. voltage drop across measurement terminals A3 and A4 and across measurement terminals A5, A6. Similarly, the frequency-conductance characteristics of sample diode 3 at various frequencies can be obtained by sweeping the output frequency of A.C. power source 1.

However, the D.C. voltage drop across the diode 3 may not correspond to the D.C. bias voltage measured at terminal 10 or to the voltage output of source 11. The measurement at terminal 10 does not take into account the voltage drops across resistor 2, FIG. 3 is a plot of the D.C. voltage and D.C. current across diode 3 versus the output voltage of D.C. power source 11 when the measurement apparatus of FIG. 2 is used to apply a D.C. bias voltage to diode 3. As FIG. 3 shows, the D.C. current through diode 3 increases as the output voltage of D.C. power source 11 increases. The voltage drop across source resistor 2 increases as the current in the circuit increases and this leads to unnegligible errors in the conductance values measured versus applied D.C. voltage if the D.C. voltage is not measured at monitoring terminal 10. When the output voltage of D.C. power source 11 is 1.0 V, this error is 20% because of the measurement error caused by the voltage drop across source resistor 2.

An additional source of error is the voltage drop across the input terminals of operational amplifier 5. Since the amplification factor of amplifier 5 cannot be infinite, the input impedance (approximately equal to the resistance of vaiable range resistor 4 divided by said amplification factor) cannot be zero, so a further unnegligible voltage drop occurs. The D.C. input impedance of operational amplifier 5 and the D.C. voltage drop across the input terminals of operational amplifier 5 also fluctuates with changes of the resistance of vaiable range resistor 4. These effects can lead to fluctuations in output voltage at terminal A2.

FIG. 4 shows the effects of the afore-described errors on the accuracy of a conductance measurement made on diode 3 (with the output voltage and output current of D.C. power source 11 maintained at 0.5 V and 1.0 A). The solid line curve in FIG. 4 shows the measurements made with the apparatus of FIG. 2. Apparent from this plot is the significant variation in the measured conductance value caused by changing the resistance of variable range resistor 4. In measuring the doping characteristics of a diode, a very accurate measurement of the frequency-conductance characteristics and bias voltage-capacitance characteristics of the diode is necessary. The measurement apparatus of FIG. 2 could not be used for such measurements because of its inherent relatively large measurement error. The connection of a voltmeter can be arranged to monitor D.C. voltage across diode 3. However, whenever the resistance of range resistor 4 is changed, the output voltage of D.C. power source 11 must be adjusted such that the voltage across diode 3 is the selected value.

It is a principal object of the present invention to provide measurement apparatus for obtaining various A.C. characteristics of electronic components at selected D.C. bias voltages which can be accurately maintained at the selected values across the component under test.

In accordance with the illustrated preferred embodiment of the invention, a control circuit accurately maintains the D.C. bias across the component under test. The component measurement apparatus is comprised of a D.C. power source to apply D.C. bias voltage to the component under test, an A.C. power source to apply A.C. signals to the component undr test concurrently with said D.C. bias voltage, and a control circuit to detect the D.C. voltage across said sample and to maintain the D.C. voltage across the sample at the selected value while the measurement is made.

In accordance with the present invention, a stable D.C. bias voltage is maintained across the component under test by sensing the difference between the output voltage of the D.C. bias voltage source and the voltage drop across the circuit element under test, to control the D.C. bias voltage applied and to compensate for unwanted or variable voltage drops in the measurement circuit. The apparatus of the invention compensates for both fixed resistance in the circuit and for variable resistance due to changing the range resistor. Furthermore, an ammeter can be included in the D.C. bias circuit without adversely affecting the accuracy of the measurement.

BRIEF DESCRIPTION OF THE DRAWINGS

FIG. 3 is a graph which illustrates the variation of the actual D.C. bias voltage from the desired voltage with the apparatus of FIG. 2.

FIG. 4 shows the frequency-conductance characteristics of a diode as measured by the apparatus of FIG. 2 and as measured by the apparatus of FIG. 1.

DESCRIPTION OF THE PREFERRED EMBODIMENT

Figure 1:
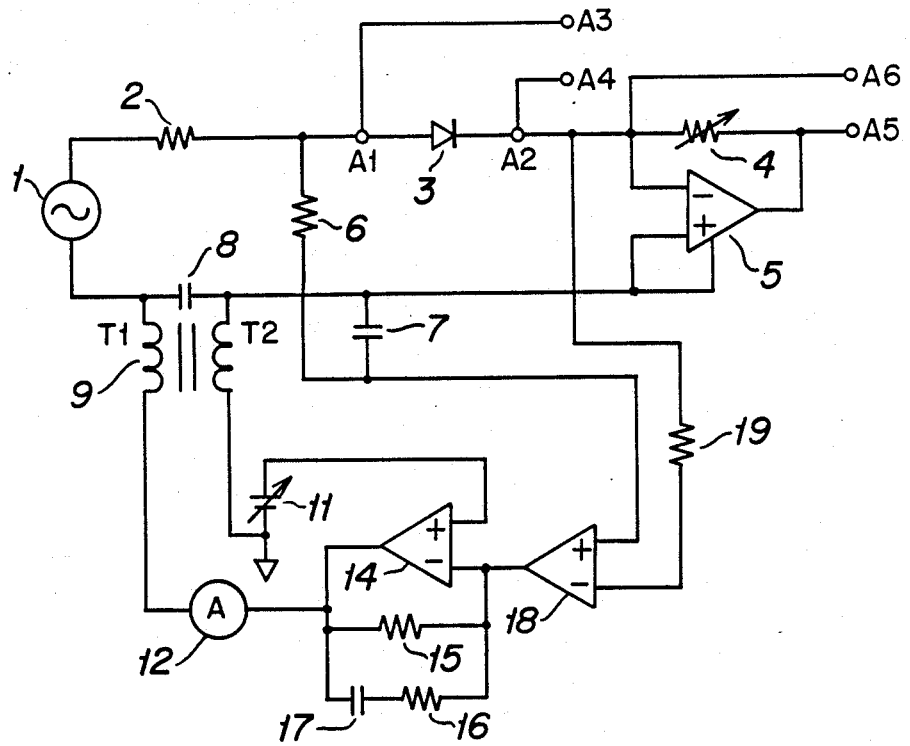
FIG. 1 is a schematic diagram of measurement apparatus constructed in accordance with the present invention.
Figure 2:
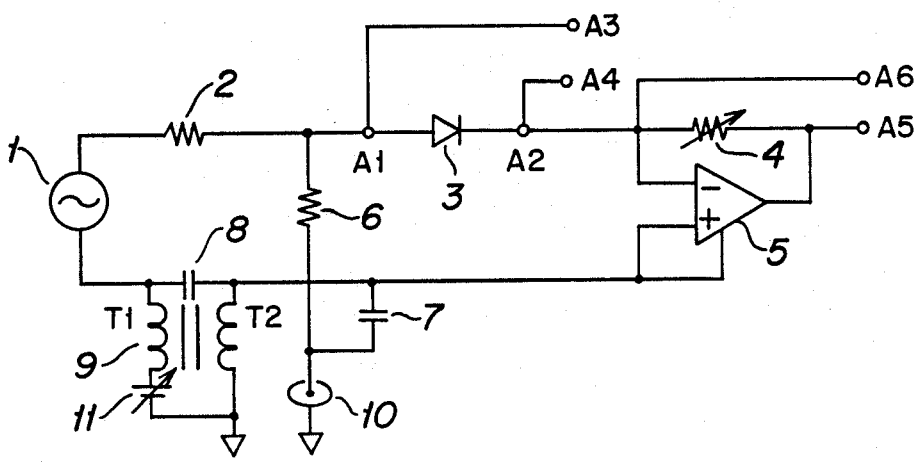
FIG. 2 is a schematic diagram of a typical measurement apparatus known in the prior art.

FIG. 1 is a schematic diagram of the measurement according to the preferred embodiment of the present invention. The same symbols and numbers are used in FIG. 2 to identify elements with corresponding functions to elements of the measurement apparatus shown in FIG. 1. Since the path of A.C. signal in the two circuits is similar, the description of A.C. signl is ommitted here. The D.C. current path within the measurement apparatus of FIG. 1 and the control circuit to maintain a fixed value of D.C. voltage across diode 3 will now be described.

In FIG. 1, the control circuit for D.C. bias voltage includes two operational amplifiers 14 and 18 which detect the difference between the actual voltage across the component under test and preset output voltage of D.C. source 11, then compensate for any difference. The non-inverting input of an operational amplifier 18, whose amplification factor is 1, is connected through a resistor 6 to terminal A1. The inverting input of amplifier 18 is connected through a resistor 19 to terminal A2. The output of amplifier 18 is connected to the inverting input of an operational amplifier 14. The non-inverting input of operational amplifier 14 is connected to the positive output of D.C. power source 11. Resistors 15, 16 and capacitor 17 are connected in a feedback path from the output of amplifier 14 to its inverting input. The output of operational amplifier 14 is connected through an ammeter 12 to the primary winding T1 of transformer 9.

The voltage difference between the output voltage of D.C. power source 11 and the output voltage of amplifier 18 is amplified by amplifier 14, having high gain then flows through ammeter 12, primary winding T1, A.C. power source 1, resistor 2, diode 3, variable range resistor 4, operational amplifier 5, secondary winding T2 and to ground. Since the input impedance of amplifier 18 is very large, almost no current flows through resistors 6 and 19, and the D.C. voltage drop across diode 3 is applied across the input terminals of amplifier 18. Since the amplification factor of amplifier 18 is 1, the D.C. voltage across diode 3 is directly applied to the inverting input terminal of operational amplifier 14. Thus, the voltage difference between the D.C. voltage across diode 3 and output voltage of D.C. power source 11 is amplified by amplifier 14. The circuit loop comprised of amplifier 14, ammeter 12, primary winding T1, A.C. power source 1, resistor 2, diode 3, resistors 6 and 19 and amplifier 18 is stabilized when the output voltage of D.C. power source 11 and output voltage of amplifier 18 are equal. Thus, the actual D.C. bias voltage across diode 3 can be controlled at any desired value by setting the output voltage of D.C. power source 11. After the desired value for the output voltage of D.C. power source 11 is set, the A.C. characteristics of diode 3 can be measured in accordance with the afore-described customary measurement procedure.

The result of the measurement of the frequency-conductance characteristics of diode 3 with the measurement apparatus of FIG. 1 is shown by the dashed line in FIG. 4. The improvement in measurement accuracy is apparent from the consistency of the measured value over a range of frequencies.

In addition, although operational amplifier 18 in the illustrated embodiment has an amplification factor of 1, other values for the amplification factor may be chosen as are appropriate for the measurement.

We claim:

1. Apparatus for measuring A.C. characteristics of a component to which superimposed A.C. signals and D.C. bias voltages are applied, in a measurement circuit having a variable range resistor, comprising:

an A.C. signal source connected to the component under test for providing the A.C. signal across the component;

a D.C. variable voltage source connected with the A.C. signal source for providing a selected D.C. bias voltage superimposed on the A.C. signal;

means for detecting the D.C. voltage drop across the component under test;

control means including an operational amplifier with high gain for comparing the D.C. voltage drop across the component under test with the output voltage of the D.C. variable voltage source to control the applied D.C. voltage to maintain the D.C. voltage drop across the component under test substantially equal to the output voltage of the D.C. variable voltage source; and means for measuring the A.C. characteristics of the component under test.

2. Measurement apparatus as in claim 1 wherein the means for detecting the D.C. voltage drop across the compponent under test comprises an amplifier having unity gain, and having an inverting input connected to one side of the component under test and a noninverting input connected to the other side of the component under test.

* * * * *